(12) United States Patent
Kim et al.

(10) Patent No.: US 10,862,460 B2
(45) Date of Patent: Dec. 8, 2020

(54) DUTY CYCLE CONTROLLER

(71) Applicants: SK hynix Inc., Icheon-si (KR); Seoul National University R&DB Foundation, Seoul (KR)

(72) Inventors: Jaewook Kim, Seoul (KR); Mino Kim, Seoul (KR); Suhwan Kim, Seoul (KR); Deog-Kyoon Jeong, Seoul (KR)

(73) Assignees: SK hynix Inc., Icheon-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/523,751

(22) Filed: Jul. 26, 2019

(65) Prior Publication Data

US 2019/0348971 A1    Nov. 14, 2019

Related U.S. Application Data

(62) Division of application No. 16/000,582, filed on Jun. 5, 2018, now Pat. No. 10,411,675.

(30) Foreign Application Priority Data

Jun. 9, 2017 (KR) .......................... 10-2017-0072398

(51) Int. Cl.
| | |
|---|---|
| *H03K 3/017* | (2006.01) |
| *H03K 5/06* | (2006.01) |
| *H03K 5/135* | (2006.01) |
| *H03K 21/02* | (2006.01) |
| *H03K 5/26* | (2006.01) |
| *H03K 5/00* | (2006.01) |

(52) U.S. Cl.
CPC ............... *H03K 3/017* (2013.01); *H03K 5/06* (2013.01); *H03K 5/135* (2013.01); *H03K 5/26* (2013.01); *H03K 21/02* (2013.01); *H03K 2005/00156* (2013.01)

(58) Field of Classification Search
CPC .......... H03K 3/017; H03K 5/06; H03K 5/065; H03K 5/05; H03K 5/04; H03K 5/135; H03K 5/26; H03K 21/02; H03K 2005/00156
See application file for complete search history.

(56) References Cited

U.S. PATENT DOCUMENTS

| | | |
|---|---|---|
| 6,437,618 B2 | 8/2002 | Lee |
| 6,879,201 B1 | 4/2005 | Chan |

(Continued)

FOREIGN PATENT DOCUMENTS

KR   100422585 B1   3/2004

*Primary Examiner* — Patrick C Chen
(74) *Attorney, Agent, or Firm* — William Park & Associates Ltd.

(57) ABSTRACT

In an embodiment, a duty cycle controller comprises a delay circuit configured to output the feedback clock signal by delaying an output clock signal combined from an input clock signal and a feedback clock signal by a predetermined delay time, wherein the delay circuit comprises a unit delay circuit configured to delay the output clock signal by a time less than the predetermined delay time and configured to delay the feedback clock signal by the predetermined delay time by letting the output clock signal pass the unit delay circuit as many as a predetermined loop count.

14 Claims, 7 Drawing Sheets

(56) References Cited

U.S. PATENT DOCUMENTS

| | | | |
|---|---|---|---|
| 7,643,359 B2* | 1/2010 | Lee | G11C 7/1072 |
| | | | 327/155 |
| 7,716,001 B2 | 5/2010 | Lee et al. | |
| 2010/0283520 A1 | 11/2010 | Ku | |
| 2013/0249722 A1* | 9/2013 | Terazawa | H03M 1/1009 |
| | | | 341/120 |
| 2016/0013796 A1* | 1/2016 | Choi | H03L 7/0802 |
| | | | 327/158 |
| 2016/0036428 A1* | 2/2016 | Wang | H03K 19/1737 |
| | | | 327/437 |

* cited by examiner

FIG. 1

<PRIOR ART>

DUTY CYCLE CONTROLLER

CROSS-REFERENCE TO RELATED APPLICATIONS

This application is a divisional application of U.S. application Ser. No. 16/000,582, filed on Jun. 5, 2018, which claims priority of Korean Patent Application Number 10-2017-0072398, filed on Jun. 9, 2017, which is incorporated herein by reference in their entirety.

BACKGROUND

1. Technical Field

Various example embodiments may generally relate to a delay circuit and a duty cycle controller including the same, and more particularly, to a delay circuit and a duty cycle controller occupying a minimal circuit area.

2. Related Art

Figure 1:
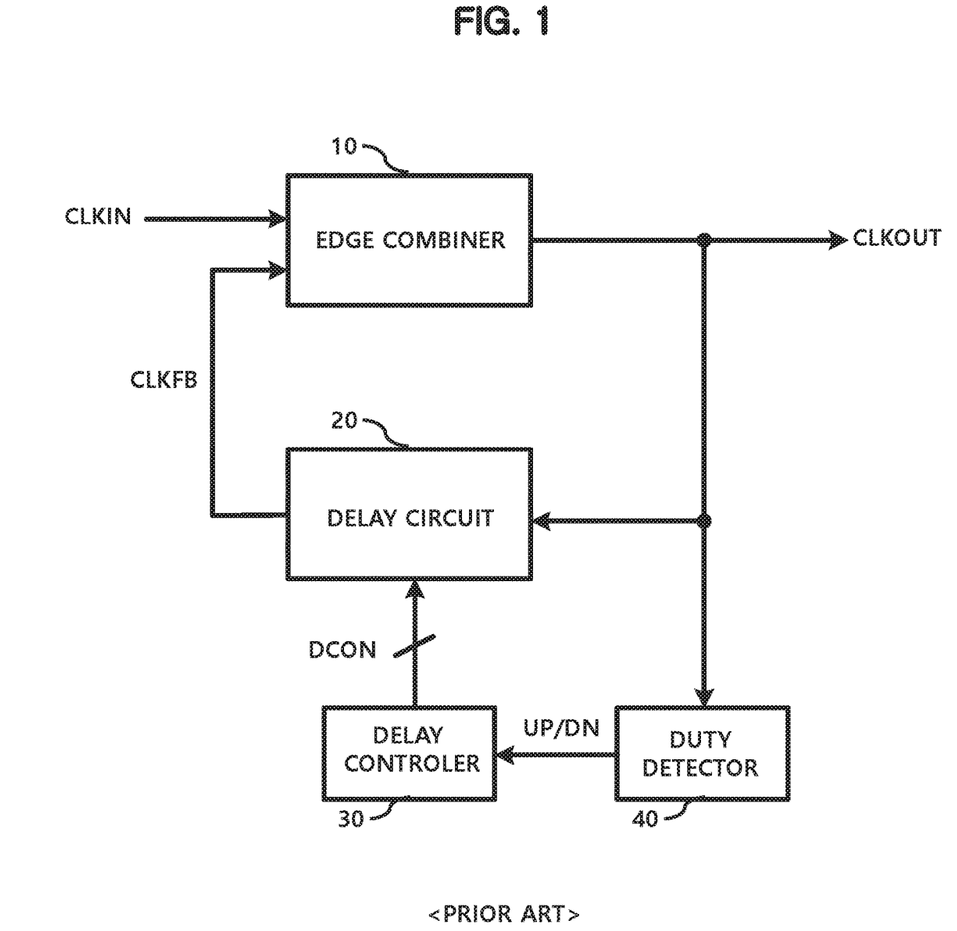
FIG. 1 is a block diagram illustrating a conventional duty cycle controller.

FIG. 1 is a block diagram illustrating a conventional duty cycle controller.

The conventional duty cycle controller includes an edge combiner 10, a delay circuit 20, a delay controller 30, and a duty detector 40.

The edge combiner 10 combines edges of an input clock signal CLKIN and a feedback clock signal CLKFB to generate an output clock signal CLKOUT.

The delay circuit 20 delays the output clock signal CLKOUT and outputs the feedback clock signal CLKFB.

Accordingly, the feedback clock signal CLKFB has a pulse that rises after a lapse of one half period after the rising pulse of the input clock signal CLKIN.

The edge combiner 10 combines edges of these two clock signals to generate an output clock signal CLKOUT having a pulse that rises at a rising edge of the input clock signal CLKIN and falls at a falling edge of the feedback clock signal CLKFB.

The output clock signal CLKOUT preferably has a duty ratio of 1/2.

The duty detector 40 senses the duty ratio of the output clock signal CLKOUT and activates an UP signal when the duty ratio is greater than or equal to 1/2 and activates a DN signal when the duty ratio is less than or equal to 1/2.

The delay controller 30 outputs a delay control signal DCON according to the UP/DN signal.

For example, when the UP signal is activated the delay control signal DCON increases the delay time of the delay circuit 20, and when the DN signal is activated the delay control signal DCON decreases the delay time of the delay circuit 20.

With this feedback control, the duty ratio of the output clock signal CLKOUT can be controlled to remain at 1/2.

A duty cycle controller using an edge combiner not only can accurately control the duty ratio, but also has an advantage in that the duty cycle control can be performed even with a wide duty error.

However, the duty cycle controller using an edge combiner needs a delay circuit for delaying a period of the clock signal by half.

The delay circuit 20 is designed to control the number of serially connected inverters, which requires a very large area to delay the input clock signal CLKIN for a half period.

This increases the size of the duty cycle controller.

It is becoming physically difficult to arrange a large delay circuit in a chip because increasing size constraints of the chip itself.

Also, when the operating frequency of the semiconductor device is increased, it is difficult to accurately control a delay time in a large delay circuit considering various process variations.

Accordingly, a delay circuit with a reduced area and a duty cycle controller including the delay circuit are required.

SUMMARY

In an embodiment, a delay circuit comprises a delay loop controller configured to output a signal obtained by operating a start signal and a delayed feedback clock signal output from outside the loop controller; and a loop counter configured to determine whether a predetermined delay time has elapsed since the start signal was input according to the delayed feedback clock signal and a predetermined loop count.

In an embodiment, a duty cycle controller comprises a delay circuit configured to output the feedback clock signal by delaying an output clock signal combined from an input clock signal and a feedback clock signal by a predetermined delay time, wherein the delay circuit comprises a unit delay circuit configured to delay the output clock signal by a time less than the predetermined delay time and configured to delay the feedback clock signal by the predetermined delay time by letting the output clock signal pass the unit delay circuit as many as a predetermined loop count.

DETAILED DESCRIPTION

Various embodiments will be described below with reference to the accompanying drawings.

Figure 2:
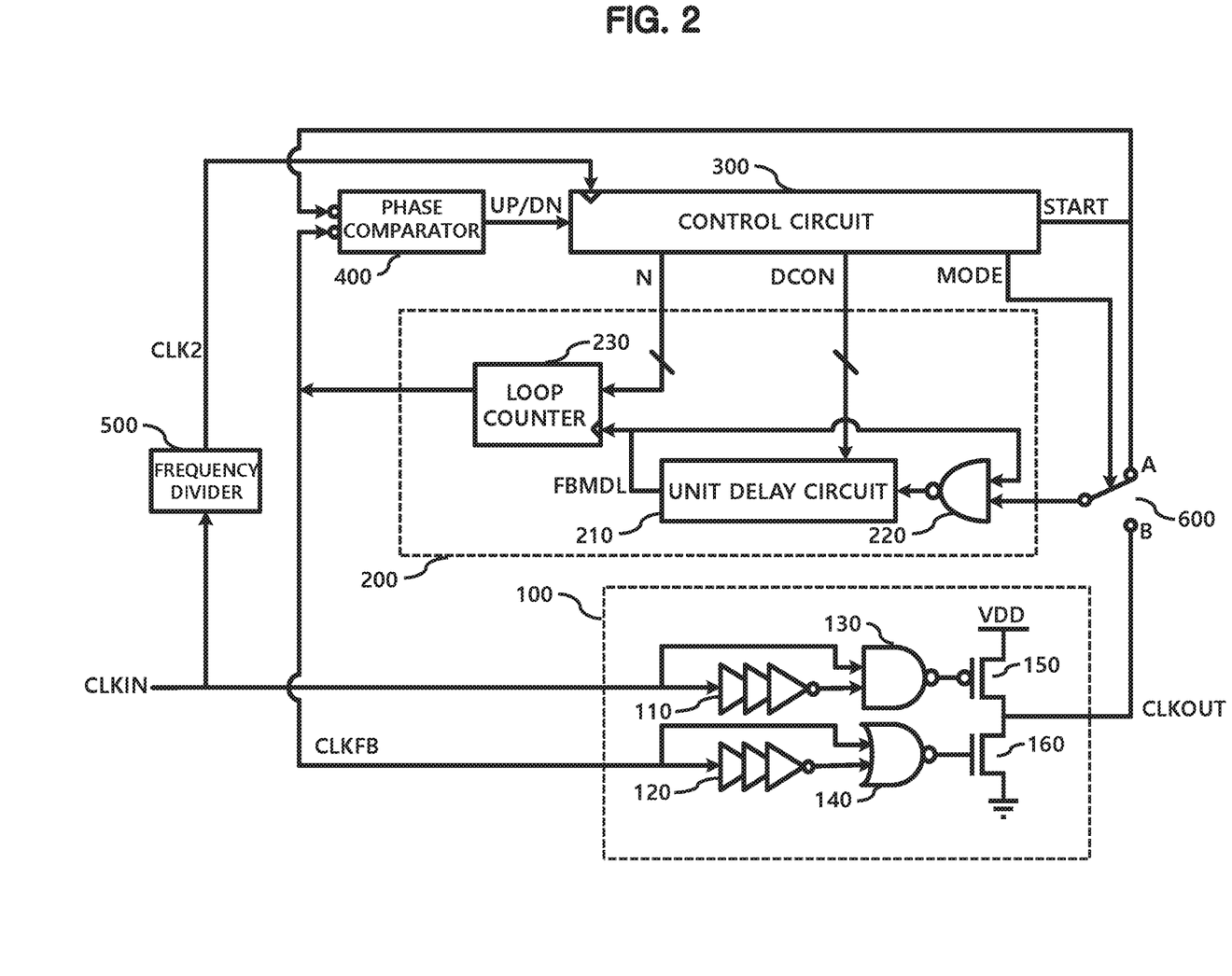
FIG. 2 is a block diagram illustrating a duty cycle controller during a training operation according to an embodiment of the present disclosure.

FIG. 2 is a block diagram illustrating a duty cycle controller according to an embodiment of the present disclosure.

The duty cycle controller according to an embodiment of the present disclosure includes an edge combiner 100, a delay circuit 200, and a control circuit 300.

The duty cycle controller according to an embodiment of the present disclosure may further include a phase comparator 400, a frequency divider 500, and a mode selector 600.

The edge combiner 100 includes a first pulse generator for generating a low level pulse at the rising edge of the input clock signal CLKIN, and a second pulse generator for generating a high level pulse at the falling edge of the feedback clock signal CLKFB.

In this embodiment, the feedback clock signal CLKFB has a pulse shape that generally maintains a high level and falls at a specific time.

The first pulse generator includes an inversion delay circuit 110 and a NAND gate 130.

The PMOS transistor 150 is turned on in a low level period of the signal output from the first pulse generator to turn the output clock signal CLKOUT to a high level.

The second pulse generator includes an inversion delay circuit 120 and a NOR gate 140.

The NMOS transistor 160 is turned on in a high level period of the signal output from the second pulse generator to turn the output clock signal CLKOUT to a low level.

Thus, the duty ratio of the output clock signal CLKOUT is determined by the time between the rising edge of the input clock signal CLKIN and the falling edge of the feedback clock signal CLKFB.

The delay circuit 200 delays the output clock signal CLKOUT so that the falling edge of the feedback clock signal CLKFB is generated when a half period elapses since the rising edge of the input clock signal CLKFB.

Therefore, the duty ratio of the output clock signal CLKOUT can be controlled to be 1:1.

The duty ratio can be controlled to have an arbitrary ratio by controlling the delay time of the delay circuit 200.

The mode selector 600 changes the position of the switch to A or B in accordance with the mode control signal MODE output from the control circuit 300.

The position of the switch is A during a training operation, and the position of the switch is B during normal operation.

During the training operation the delay time of the delay circuit 200 can be adjusted according to control of the control circuit 300.

The control circuit 300 determines the delay time of the delay circuit 200 so that a falling edge of the feedback clock signal CLKFB occurs when a half cycle T/2 elapses from the rising edge of the input clock signal CLKIN.

In the prior art, the delay circuit 20 is designed to have a half period of the input clock signal CLKIN and occupy a large area.

However, the delay circuit 200 according to an embodiment of the present disclosure achieves the required delay time by controlling a signal to pass to a unit delay circuit 210 several times, where a delay time of the unit delay circuit 210 is shorter than a half period of the input clock signal CLKIN.

The delay circuit 200 according to the present disclosure includes the unit delay circuit 210, a delay loop controller 220, and a loop counter 230.

The unit delay circuit 210 may have a shorter delay time than a half period of the input clock signal. The delay time can be adjusted by the control circuit 300. The unit delay circuit 210 may be coupled with the delay loop controller 220 and the loop counter 230.

More specifically, the delay time of the unit delay circuit 210 can be controlled according to the delay control signal DCON applied from the control circuit 300.

The delay control signal DCON may include a coarse delay control signal for controlling large scale delay times and a fine delay control signal for controlling small scale delay times.

The delay loop controller 220 applies a delayed feedback clock signal FBMDL of the unit delay circuit 210 to an input terminal of the unit delay circuit 210 when the start signal START is at a high level to form a delay loop.

The loop counter 230 compares the number of rising edges of the delayed feedback clock signal FBMDL with the number of loops N set in the control circuit 300.

Thus, it is possible to determine whether the delay time of a signal that passes the unit delay circuit 210 a plurality of times is equal to the desired delay time.

Figure 3:
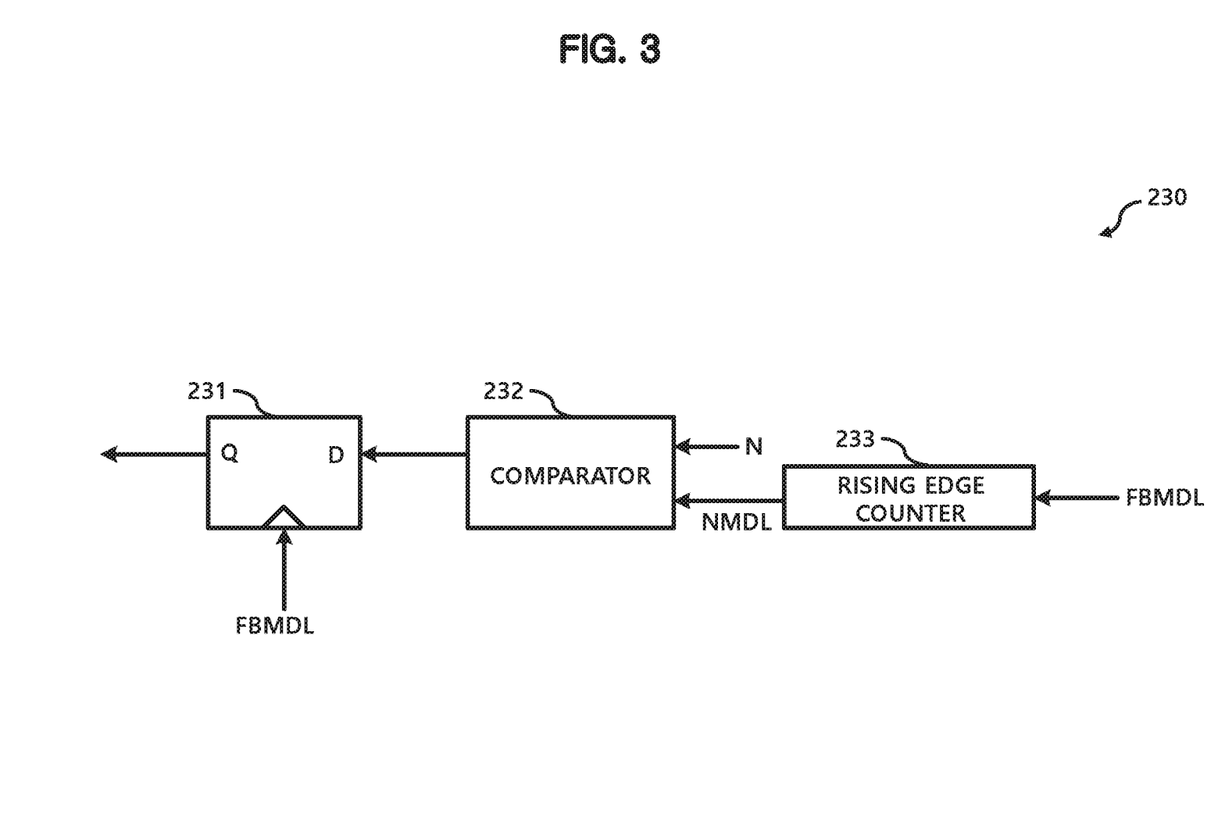
FIG. 3 is a block diagram illustrating a loop counter according to an embodiment of the present disclosure.

FIG. 3 is a detailed block diagram of the loop counter 230.

The loop counter 230 includes a flip-flop 231, a comparator 232, and a rising edge counter 233.

The rising edge counter 233 counts the number of rising edges of the delayed feedback clock signal FBMDL.

The comparator 232 compares the number of rising edges NMDL output from the rising edge counter 233 with the number of loops N provided from the control circuit 300.

In this embodiment, the comparator 232 outputs a high level signal when the number of loops N is larger, and outputs a low level signal otherwise.

The flip-flop 231 latches the output of the comparator 232 at the rising edge of the delayed feedback clock signal FBMDL.

In this embodiment, the output of the comparator corresponding to the k-th rising edge of the delayed feedback clock signal FBMDL is latched in the flip-flop 231 at the (k+1)-th rising edge of the delayed feedback clock signal FBMDL.

The control circuit 300 can control the number of loops N and the delay time of the unit delay circuit 210 in the training mode.

In the present embodiment, both the number of loops N and the delay time of the unit delay circuit 210 can be adjusted.

For example, in order to delay 100 ps, the delay time of the unit delay circuit may be set to 20 ps and the number of loops may be set to 5, or the delay time of the unit delay circuit may be set to 50 ps and the number of loops may be set to 2.

The frequency range of the input clock signal CLKIN usable as an input signal may be limited according to the delay time of the unit delay circuit 210 when the number of loops N is fixed.

The frequency range of the input clock signal CLKIN can be further extended as compared with the former case when the number of loops N can be adjusted.

As described above, in the present disclosure, the entire circuit area of the delay circuit 200 can be reduced, and a desired delay time can be stably achieved in a wide frequency range.

Figure 4:
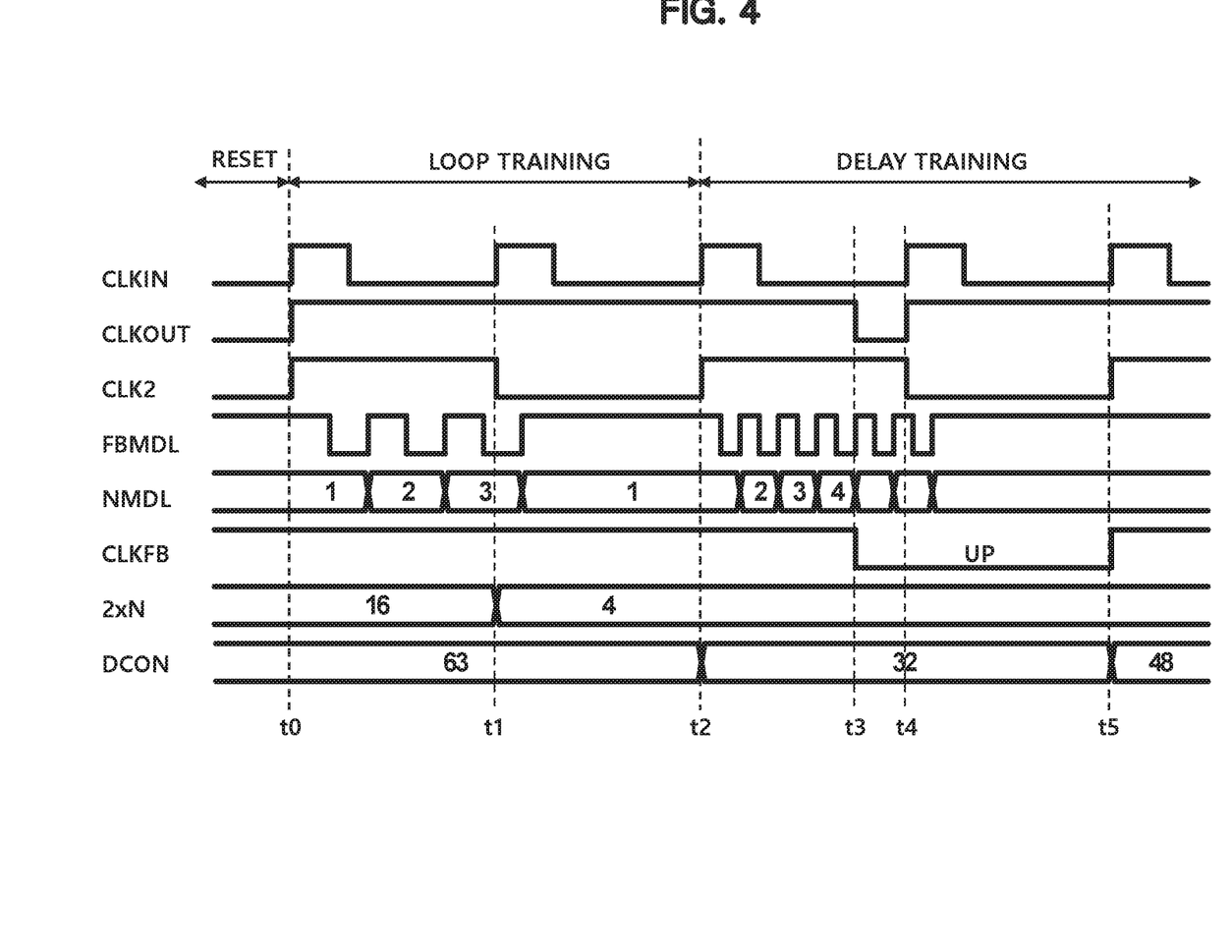
FIG. 4 is a timing diagram illustrating a training operation of a duty cycle controller according to an embodiment of the present disclosure.

FIG. 4 is a timing diagram illustrating a training operation of the duty cycle controller according to an embodiment of the present disclosure.

In this embodiment, the training operation is controlled by the control circuit 300.

In this embodiment, the training operation includes a loop training operation for determining the number of loops N and a delay training operation for adjusting the delay time of the unit delay circuit 210. The loop training operation is performed first.

Hereinafter, a period of the input clock signal CLKIN is denoted by T.

When the reset state ends at t0, the input clock signal CLKIN begins to be input.

The frequency divider 500 divides the frequency of the input clock signal CLKIN by a factor of two to output the divided clock signal CLK2. The division ratio may vary depending on the embodiment.

In this embodiment, the divided clock signal CLK2 is a reference for the training operation, and the control circuit 300 performs the training operation based on the time from the rising edge to the falling edge of the divided clock signal CLK2.

The period in which the divided clock signal CLK2 is at the high level corresponds to one period of the input clock signal CLKIN.

The start signal START output from the control circuit 300 during the training operation has a substantially same waveform as the divided clock signal CLK2.

The start signal START of the high level is applied to the delay loop controller 220 through the mode selector 600 and the delayed feedback clock signal FBMDL is output from the unit delay circuit 210 accordingly.

The delay time of the unit delay circuit 210 is initialized to the maximum value.

In this embodiment, it is assumed that the delay time of the unit delay circuit 210 has a positive correlation with the value of the delay control signal DCON.

Accordingly, the value of the delay control signal DCON is initialized to the maximum value 63.

During the loop training operation, the number of loops N can be initialized to any value.

In FIG. 4, a value twice the number of loops N is displayed.

The reason why a value twice the number of loops N is displayed is that the value of N is a value related to a half period of the input clock signal CLKIN, but the high level interval of the divided clock signal CLK, which is a basis for a training operation, corresponds to one period of the clock signal CLKIN.

It is assumed that the maximum value of the number of loops N is 8, and that the number of loops N outputted from the control circuit 300 is also initialized to 8 in this embodiment.

The rising edge counter 233 accumulates the count value NMDL in accordance with the rising edge of the delayed feedback clock signal FBMDL while the delayed feedback clock signal FBMDL is toggled after to.

The loop training operation is completed at time t1, that is, at the falling edge of the divided clock signal CLK2, and when the number of loops N is determined.

In the present embodiment, when the count value of the rising edge counter 233 at the time t1 is an even number, the control circuit 300 sets the number of loops N to 1/2 the count value. When the count value at t1 is an odd number, the control circuit 300 sets the number of loops N to 1/2 the count value plus 1.

Accordingly, the value of the number of loops N is determined to be 2 at t1.

When the divided clock signal CLK2 rises at t2, the loop training operation ends, and the delay training operation begins.

In the delay training operation, the value of the delay control signal DCON is determined.

In the delay training operation, the control circuit 300 fixes the number of loops N to 2, which is determined in the loop training operation.

In this embodiment, the delay control signal DCON is a multi-bit digital signal.

The value of the delay control signal DCON is set to 32, which is half the maximum value, such that the unit delay circuit 210 has a delay time corresponding to 1/2 the maximum delay time.

This corresponds to an operation for sequentially determining the delay control signal DCON, which is a multi-bit digital signal, from the upper bit to the lower bit using a binary search technique.

The rising edge counter 233 accumulates the count value NMDL in accordance with the rising edge of the delayed feedback clock signal FBMDL while the delayed feedback clock signal FBMDL is toggled after t2.

At t3, the delayed feedback clock signal FBMDL transits to the high level, and the flip-flop 231 latches and outputs the output of the rising edge counter 233 NMDL.

Accordingly, the output of the loop counter 230 CLKFB transits from a high level to a low level at t3.

The phase comparator 400 compares the feedback clock signal CLKFB with the inversion of the start signal START and outputs the comparison result as UP or DN.

At t3, the feedback clock signal is first brought to a low level and thus the UP signal is generated.

The UP signal indicates that the delay time generated by repeating the delay time of the unit delay circuit 210 by 2N times is longer than one cycle of the clock signal.

The control circuit 300 increases the delay control signal DCON when the UP signal is generated and decreases the delay control signal DCON when the DN signal is generated.

For example, increasing the delay control signal corresponds to setting the next lower bit to 1 while maintaining the current bit of the delay control signal DCON, and decreasing the delay control signal corresponds to setting the current bit value to 0 and to setting the next lower bit to 1.

At t5, the delay training operation for the next lower bit is terminated.

After t5, the operations of t2 to t5 described above are repeated, and the entire bit values of the delay control signal DCON are sequentially determined.

Figure 5:
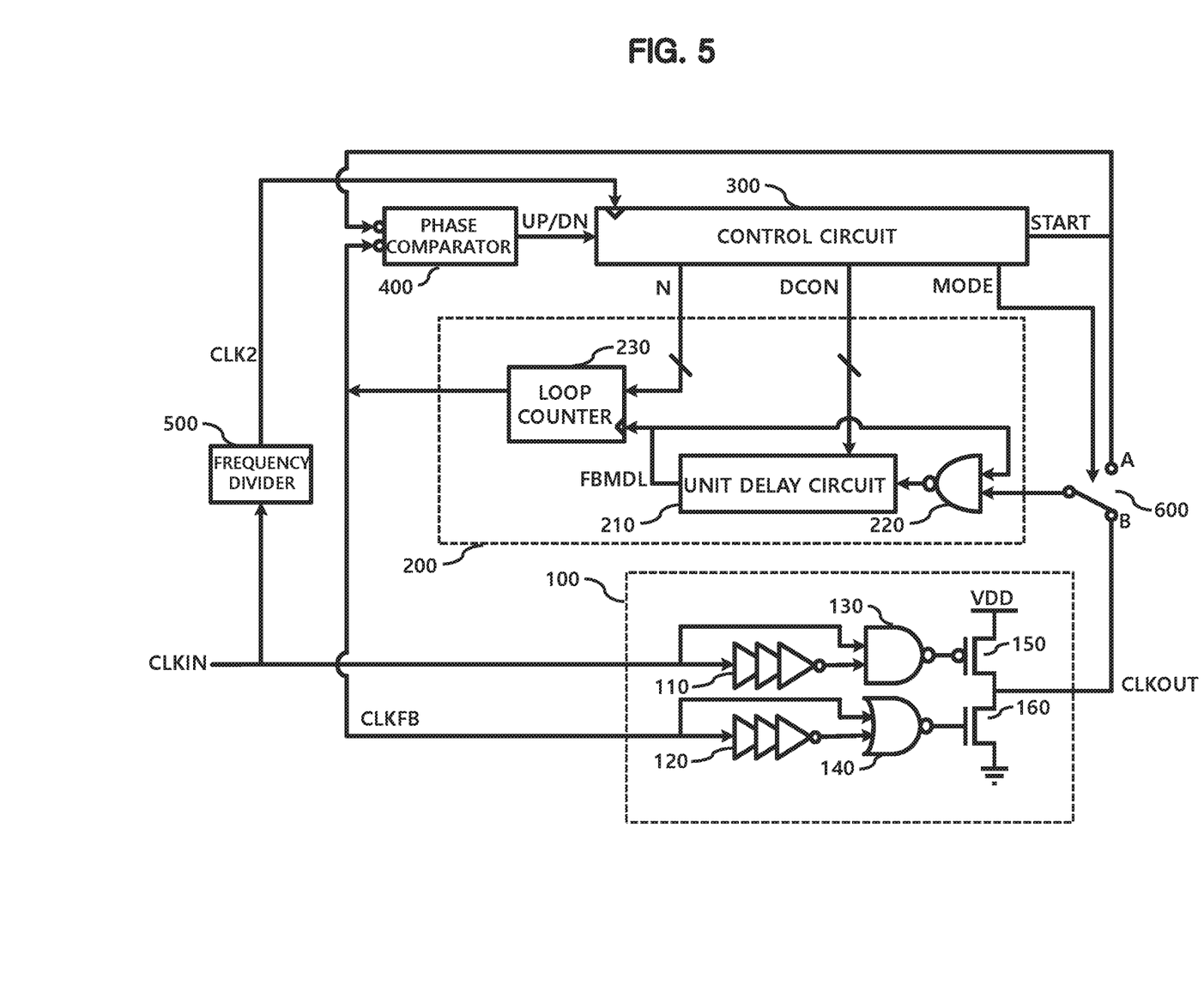
FIG. 5 is a block diagram illustrating a duty cycle controller during a normal operation according to an embodiment of the present disclosure.

FIG. 5 is a block diagram of a duty cycle controller performing a normal operation according to an exemplary embodiment of the present disclosure.

In FIG. 5, the control circuit 300 outputs a mode signal MODE corresponding to normal operation, and accordingly, the switch of the mode selector 600 moves to B.

The control circuit 300 fixes the number of loops N and the delay control signal DCON determined in the training operation.

The frequency divider 500 and the phase comparator 400 do not affect normal operation and therefore power may possibly not be supplied to the frequency divider 500 and the phase comparator 400.

Other configurations are the same as those shown in FIG. 2, and thus a detailed description thereof will be omitted.

Hereinafter, operation of the delay circuit 200 and controlling the duty cycle of the output clock signal CLKOUT are disclosed with reference to timing diagrams.

Figure 6:
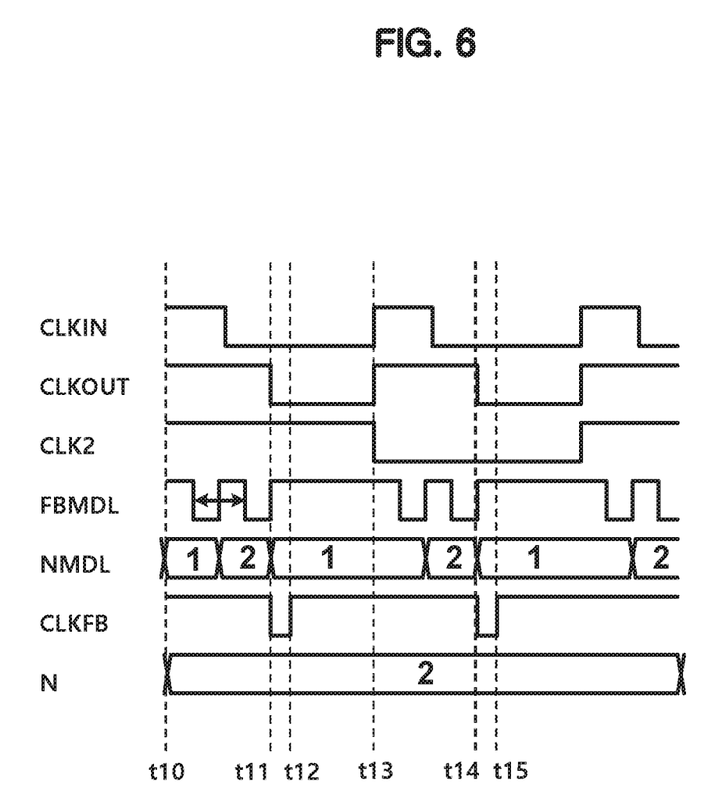
FIGS. 6 to 7 are timing diagrams illustrating normal operation of a duty cycle controller according to an embodiment of the present disclosure.

FIG. 6 is a timing diagram illustrating normal operation of the duty cycle controller according to an embodiment of the present disclosure.

It is assumed in FIG. 6 that the number of loops N determined through the training operation is 2.

At t10, the input clock signal CLKIN becomes a high level.

At this time, the output clock signal CLKOUT also becomes the high level according to operation of the edge combiner 100.

The delayed feedback clock signal FBMDL output from the unit delay circuit 210 begins to toggle while the high level output clock signal CLKOUT is input to the delayed loop controller 220.

The rising edge counter 233 of the loop counter 230 accumulates a number of rising edges NMDL of the delayed feedback clock signal FBMDL from the initial value 1.

The comparator 232, the output of the flip-flop 231, and the feedback clock signal CLKFB maintain a high level when the initial output NMDL of the rising edge counter 233 is less than the number of loops N.

At t11, the low level output of the comparator 232 is latched in the flip-flop 231 so that the output of the flip-flop 231 transits to the low level and thus the output of the feedback clock signal CLKFB also transits to the low level.

As the feedback clock signal CLKFB transits to the low level, the edge combiner 100 changes the level of the output clock signal CLKOUT to the low level.

When the output clock signal CLKOUT transits to the low level, the output of the delay loop controller 220 is fixed to the high level, and the output of the unit delay circuit 210, that is, the level of the delayed feedback clock signal FBMDL is fixed to the high level after a delay time at the unit delay circuit 210.

In the normal operation, when the output clock signal CLKOUT transits to the low level, the output of the rising edge counter 233 is initialized to 1 and the output of the flip-flop 231 is initialized to the high level.

As a result, the feedback clock signal CLKFB transits to a high level at t12.

Operations at t13, t14, and t15 are the same as those at t10, t11, and t12, respectively.

Through the training operation, a falling pulse of the feedback clock signal CLKFB generated after passing through the unit delay circuit 210 occurs twice when delayed by a half period since the rising edge of the input clock signal CLKIN.

Therefore, the duty cycle of the output clock signal CLKOUT can be controlled to be at 50%.

Figure 7:
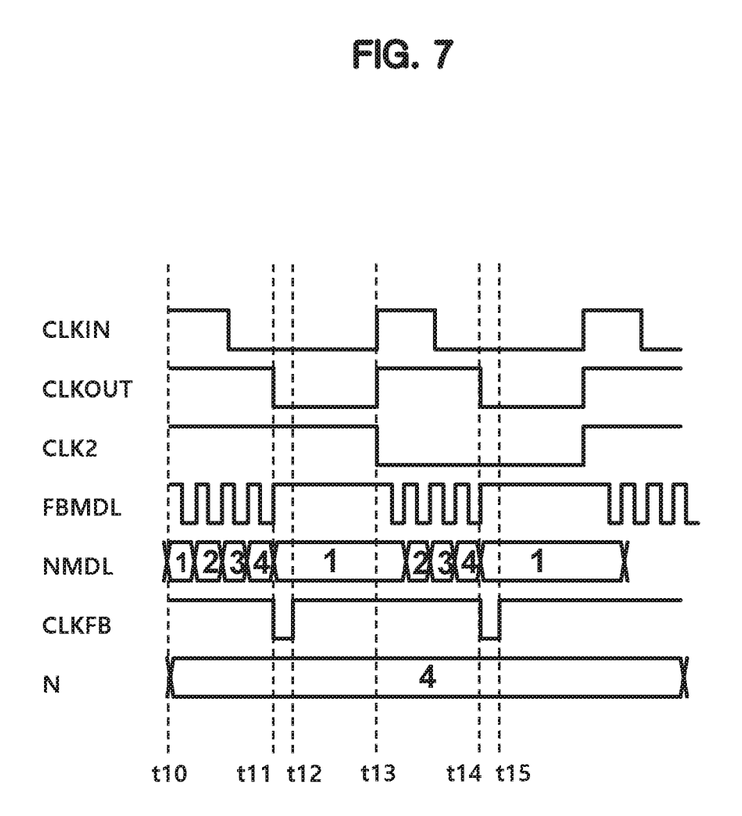

FIG. 7 is another timing diagram illustrating a normal operation of the duty cycle controller according to an embodiment of the present disclosure.

It is assumed in FIG. 7 that the number of loops N determined through the training operation is 4.

In FIG. 7, a falling pulse of the feedback clock signal CLKFB generated after passing through the unit delay circuit 210 occurs 4 times when delayed by a half period since the rising edge of the input clock signal CLKIN.

The delay circuit according to the present disclosure can reduce the area of the delay circuit by passing a unit delay circuit a plurality of times to obtain a desired delay time.

The number of times the unit delay circuit is passed and the delay time of the unit delay circuit in the delay circuit according to the present disclosure can be adjusted through a training operation.

The duty cycle controller according to the present disclosure adopts an edge-combining duty cycle control scheme, which is advantageous for accurate duty cycle control and is easy to control the duty ratio even when the duty error is large.

The duty cycle control apparatus according to the present disclosure can reduce the area of the delay circuit and reduce the entire circuit area.

Although various embodiments have been described for illustrative purposes, it will be apparent to those skilled in the art that various changes and modifications may be made without departing from the spirit and scope of the disclosure as defined in the following claims.

What is claimed is:

1. A duty cycle controller comprising:
   a delay circuit configured to output a feedback clock signal by delaying an output clock signal obtained from an input clock signal and the feedback clock signal, by a desired predetermined delay time,
   wherein the delay circuit comprises a unit delay circuit having an input and an output and is configured to provide a fixed delay time to a clock signal passing from the input of the unit delay circuit to the output of the unit delay circuit;
   wherein the delay circuit provides said desired predetermined delay time by causing the output clock signal to repeatedly pass through the unit delay circuit a predetermined number of times until the sum of fixed delay times provided by each pass of the output clock signal through the unit delay circuit, is substantially equal to the desired predetermined delay time.

2. The duty cycle controller of claim 1, wherein a maximum delay time of the unit delay circuit is less than or equal to half the predetermined delay time.

3. The duty cycle controller of claim 1, a time between an edge of an input clock signal and an edge of the feedback clock signal corresponds to a half period of the input clock signal.

4. The duty cycle controller of claim 1, further comprising an edge combiner which comprises:
   a PMOS transistor configured to set the output clock signal to the high level at an edge of the input clock signal; and
   an NMOS transistor configured to set the output clock signal to the low level at an edge of the feedback clock signal.

5. A duty cycle controller comprising:
   a delay circuit configured to output the feedback clock signal by delaying an output clock signal combined from an input clock signal and a feedback clock signal by a predetermined delay time,
   wherein the delay circuit comprises a unit delay circuit configured to delay the output clock signal for a time less than the predetermined delay time and configured to delay the feedback clock signal for the predetermined delay time by letting the output clock signal pass the unit delay circuit as many as a predetermined loop count;
   a delay loop controller configured to output a signal to the unit delay circuit obtained by operating the output clock signal and a delayed feedback clock signal output from the unit delay circuit; and
   a loop counter configured to determine whether the predetermined delay time has elapsed since the output clock signal was input according to the delayed feedback clock signal, and configured to determine the predetermined loop count.

6. The duty cycle controller of claim 5, wherein the loop counter is configured to determine whether the predetermined delay time has elapsed by comparing a number of edges of the delayed feedback clock signal and the predetermined loop count.

7. The duty cycle controller of claim 6, wherein the loop counter comprises:
   a rising edge counter configured to calculate a number of rising edges of the delayed feedback clock signal;
   a comparator configured to compare an output of the rising edge counter with the predetermined loop count; and
   a flip-flop configured to latch an output of the comparator according to the delayed feedback clock signal.

8. The duty cycle controller of claim 5, wherein the predetermined delay time is adjusted by controlling at least one of the predetermined loop count and a delay time of the unit delay circuit.

9. The duty cycle controller of claim 8, further comprising:
a control circuit configured to control the predetermined loop count and a delay time of the unit delay circuit; and
a mode selector configured to select one of the output clock signal or a training start signal according to a mode signal from the control circuit and to selected signal to the delay circuit.

10. The duty cycle controller of claim 9, wherein the control circuit is configured to perform a loop training operation and a delay training operation during a training operation, and the control circuit is configured to adjust the predetermined loop count during the loop training operation and adjusts a delay time of the unit delay circuit.

11. The duty cycle controller of claim 10, further comprising a frequency divider configured to divide the input clock signal to generate a divided clock signal,
wherein the training start signal has substantially a same waveform as the divided clock signal during the training operation, and
wherein the control circuit is configured to fix a delay time of the unit delay circuit and configured to determine the predetermined loop count according to a number of edges of the delayed feedback clock signal generated during a period of the input clock signal while performing the loop training operation.

12. The duty cycle controller of claim 11, wherein a delay time of the unit delay circuit is fixed to maximum value.

13. The duty cycle controller of claim 11, further comprising a phase comparator configured to compare the training start signal and a phase of the loop counter,
wherein the control circuit is configured to fix a delay control signal adjusting a delay time of the unit delay circuit and configured to adjust the delay control signal while performing the delay training operation.

14. The duty cycle controller of claim 13, wherein the delay control signal is a multi-bit digital signal and the control circuit determines the multi-bit digital signal sequentially from the higher bit by repeating the delay training operation a plurality of times.

* * * * *